United States Patent [19]

Mukai

[11] Patent Number: 4,968,643
[45] Date of Patent: Nov. 6, 1990

[54] METHOD FOR FABRICATING AN ACTIVATABLE CONDUCTING LINK FOR METALLIC CONDUCTIVE WIRING IN A SEMICONDUCTOR DEVICE

[75] Inventor: Ryoichi Mukai, Kawasaki, Japan

[73] Assignee: Fujitsu Limited, Kawasaki, Japan

[21] Appl. No.: 344,525

[22] Filed: Apr. 26, 1989

Related U.S. Application Data

[63] Continuation of Ser. No. 84,147, Aug. 12, 1987, abandoned.

[30] Foreign Application Priority Data

Aug. 12, 1986 [JP] Japan ................... 61-189094

[51] Int. Cl.$^5$ ............... H01L 21/268; H01L 21/311
[52] U.S. Cl. ..................... 437/174; 437/194; 437/195; 437/19; 437/245; 437/922; 437/943; 148/DIG. 93
[58] Field of Search ............... 437/19, 173, 174, 922, 437/943, 194, 195, 245, 246, 228; 219/121.69; 148/DIG. 93

[56] References Cited

U.S. PATENT DOCUMENTS

| 4,585,490 | 4/1986 | Raffel | 437/198 |
| 4,674,176 | 6/1987 | Tuckerman | 437/173 |
| 4,681,795 | 7/1987 | Tackerman | 428/209 |
| 4,800,179 | 1/1989 | Mukai | 437/173 |
| 4,814,578 | 3/1989 | Tuckerman | 437/19 |

FOREIGN PATENT DOCUMENTS

| 0167732 | 1/1986 | European Pat. Off. |
| 59-96746 | 6/1984 | Japan |

OTHER PUBLICATIONS

Smith et al. "Laser Indured Personalization . . . ", IBM–Cited in U.S. Pat. No. 4,585,490, which issued on 4/29/86.

Coburn, J. "Plasma Assisted Etching", Plasma Chem. and Plasma Processing vol. 2, No. 1, 1982, pp. 1–41.
IBM Techinical Disclosure Bulletin, vol. 21, No. 1, Jun. 1978, "Laser Connection and Disconnection Scheme", by W. Wu, p. 268.
IEEE Electron Device Letters, vol. EDL-7, No. 1, Jan. 1986, "Planarization of Gold and Aluminum Thin Films Using a Pulsed Laser", by Tuckerman et al., pp. 1–4.
Electronics, vol. 55, No. 14, Jul. 14, 1982, "Automated Welding Customizes Programmable Logic Arrays", by W. Wu, pp. 159–162.
IBM Technical Disclosure Bulletin, vol. 21, No. 3, Aug. 1978, "Joining Metal Lines With a Laser Beam Tool", by R. E. Scheuerlein, pp. 1027–1028.
IEEE Electron Device Letters, vol. EDL-8, No. 2, Feb. 1987, "High–Aspect–Ratio Via–Hole Filling with Aluminum Melting by Excimer Laser Irradiation for Multilevel Interconnection", by R. Mukai et al., pp. 76–78.
Laser Pulses Form Connections For System on a Wafer, James B. Brinton, Electronics Review, Jul. 28, 1981, pp. 39–40.

Primary Examiner—Brian E. Hearn
Assistant Examiner—Kevin McAndrews
Attorney, Agent, or Firm—Staas & Halsey

[57] ABSTRACT

A conducting link is disposed in an insulating layer of a semiconductor device in combination with a plurality of wirings of the device which are electrically separated from each other. The conducting link is selectively activated to provide the wirings with a conducting path, and is activatable by melting metal contained in the wirings by irradiating a portion of the wirings in the vicinity of the link with a shot of a pulse of laser beam. The link comprises a through hole or a trench disposed in the insulating layer depending on the structural configuration of the device. The method of fabricating and activating the conductive link is provided.

16 Claims, 7 Drawing Sheets

METHOD FOR FABRICATING AN ACTIVATABLE CONDUCTING LINK FOR METALLIC CONDUCTIVE WIRING IN A SEMICONDUCTOR DEVICE

This is a continuation of co-pending application Ser. No. 084,147 filed on Aug. 12, 1987 now abandoned.

BACKGROUND OF THE INVENTION

This invention relates to an integrated circuit (IC) semiconductor device, more particularly, an activatable conductive link disposed between electrically insulated metallic conductive wirings formed in an IC to provide a conducting path between the wirings in accordance with a requirement.

An activatable conducting link is disposed between conductive wirings which are insulated from each other. The link is initially electrically insulative, and can be converted to conductive, at any time required, by the application of an activating operation thereto.

The activatable conducting links are frequently used in cooperation with fuses in IC devices such as progamable read only memories, gate arrays and the like, which are fabricated in a master slicing system. In these ICs, in accordance with a customers order, circuit blocks previously formed therein are selectively connected to each other or disconnected from each other using the conductive links or fuses which are activated (put in operation) by the irradiation of an energy beam, usually a laser beam.

Meanwhile, as the degree of integration of ICs grows, the necessity for redundancy within IC chips increases in order to enhance production yield of the device. Redundancy is implemented by providing an IC, such as a memory chip, with spare circuitry, such as spare rows or spare columns for memory cells which are tested after the final fabrication step thereof is finished. Thereafter, bad circuitries are selectively rejected by disconnecting the relevant wirings by blowing the previously formed relevant fuses, and are replaced by spare circuitries by activating the relevant conductive links previously formed. For example, one of the above-described techniques is reported by James B. Binton on page 39 to 40 of electronics, July 28, 1981, wherein conductive pathways (links) of metal-silicon alloy are selectively activated by the irradiation of an argon laser beam between metal layers.

One prior art activatable conductive link currently being used is described in relation with a master slicing system of a semiconductor device, wherein basic circuits are formed on a semiconductor substrate in advance, and thereafter, a combined whole circuit of various types is formed in response to a customer's order, by only selectively changing the interconnecting wirings between the basic circuits. FIG. 1 is a cross-sectional view, illustrating a prior art conductive link for changing an interconnecting wiring. Of the reference numerals, 1 denotes a silicon substrate, 2 denotes a silicon dioxide ($SiO_2$) layer formed on the silicon substrate 1, 3 denotes a phospho-silicate-glass (PSG) layer formed as an insulating layer interposed between the associated layers, 4 denotes an activatable conducting element made of polycrystaline silicon (polysilicon), and 5 denotes an aluminum layer. The portions 4a of polysilicon of the activatable conducting element 4 which contact the aluminum layer 5, are highly doped with phosphorous dopants, having a low electrical resistance, but the center portion 4b of the element 4 is non-doped, resulting in a highly resistive element. It is assumed that in order to set up a required whole circuit system, the polysilicon element 4 is required to be changed to be conductive. With the prior art technology, the element 4 is irradiated by a laser beam having a continuous wavelength. As a result, phosphorus dopants contained in the high doped portions 4a of the element 4 are diffused into the non-doped portion 4b, changing the non-doped portion 4b into a conductive portion, thus activating the element 4 to be conductive.

In view of high integration packing density of the IC, the area for conductive links or fuses on the chip, is required to be as small as possible. The above-described activatable conductive element 4 occupies a considerable area on the substrate 1, leading to a low integration density of the semiconductor device, and requires a complicated fabrication procedure. Therefore, there is a need for conductive links which occupy smaller areas on a IC chip.

SUMMARY OF THE PRESENT INVENTION

An object of the present invention is to provide an activatable conductive link for connecting two aluminum or aluminum alloy wirings insulated from each other by activating the conductive link.

Another object of the present invention is to provide an activatable conductive link for connecting two wirings disposed in a two-layered structure.

Still another object of the present invention is to provide an activatable conductive link for connecting two wirings of aluminum or aluminum alloy disposed in the same level on an insulating layer.

A further object of the present invention is to provide a method for creating and activating the above-described activatable conductive links.

There is proposed, according to the present invention, a through hole, disposed in an insulator layer formed on a semiconductor substrate, having a high aspect ratio (a ratio of inner diameter to depth). Two aluminum or aluminum alloy wirings are formed respectively on the top and the back surfaces of the insulator layer, being electrically insulated from each other by the insulating layer. The through hole has an electrically insulated side wall for electrically insulating and physically connecting the two wirings. If the connection of the two stacked aluminum wirings is required, the portions of the aluminum wirings in the proximity of the through hole are irradiated by a shot of high energy excimer laser beam pulse irradiated from the top side. The aluminum included in the irradiated portions of the aluminum wirings, is melted, with the aluminum being introduced into the through hole, and filling up the through hole. Thus, the through hole is changed to be conductive. The through hole acts as an activatable conductive link between the stacked aluminum wirings.

In a similar manner, there is proposed a trench or slot having a high aspect ratio (ratio of depth to lateral width) disposed in an insulating layer formed on a substrate of a semiconductor device such as an IC, intercepting an aluminum wiring formed on the insulator layer. The aluminum wiring is cut into two wirings which are electrically insulated from each other by the stepped portions (side walls) of the trench where the insulating layer is exposed. If the connection of the two portions of aluminum wiring is required, the trench is filled up with melted aluminum by a shot of an excimer laser pulse in the similar manner as described above, thus making the trench conductive. The trench, therefore, acts as an activatable conductive link for connecting two portions of conductive members placed in the same level.

Particularly, the conductive links according to the present invention are substantially effective for a master slicing of a semiconductor device. Furthermore, the conductive links are substantially small, on the order of μm, occupying a small substrate area of the device, and contributing to achieving a high density integration of the device.

The methods for disposing and activating the above described below conductive links are described. These together with other objects, features and advantages of the present invention will be apparent as more fully described and claimed with reference to the accompanying drawings, wherein like reference numerals designate like parts.

DESCRIPTION OF THE PREFERRED EMBODIMENTS

Figure 1:
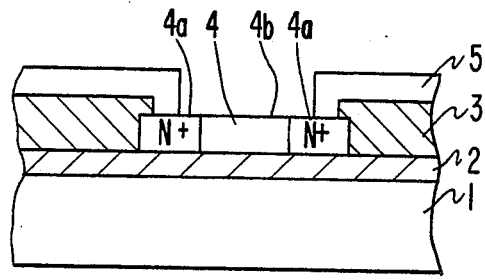
FIG. 1 is a cross-sectional view of a prior art conducting link, illustrating the structure.
Figure 2:
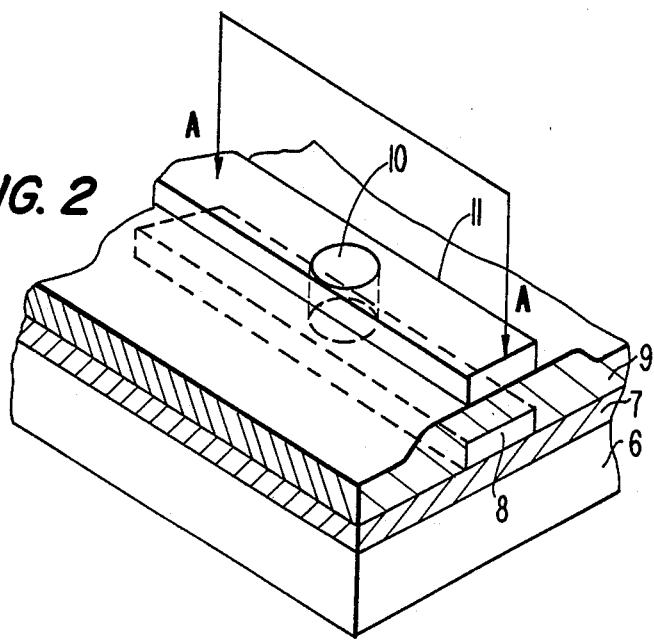
FIG. 2 is a perspective view of a conducting link of a first embodiment of the present invention.
Figure 3:
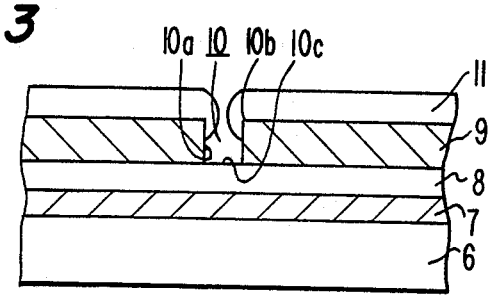
FIG. 3 is a cross-sectional view of the conducting link of FIG. 2, taken along line A—A.

FIG. 2 is a perspective view of a semiconductor device, partially broken away to reveal a structure of a first embodiment of the present invention, illustrating an activatable conductive link (a through hole) for linking two aluminum wirings arranged in a two-layered structure, and separated by a phosphorous silicate glass (PSG) layer. FIG. 3 is a cross-sectional view of the first embodiment taken along line A—A shown in FIG. 2.

The semiconductor device shown in FIG. 2 and FIG. 3, has a two-layered structure. In a portion of the device shown in FIG. 3, two aluminum wirings 8 and 11 are interposed by an insulator layer 9 of PSG, so that they are electrically insulated from each other. The lower aluminum wiring 8 is formed on another insulator layer 7 of silicon dioxide ($SiO_2$) formed over a silicon substrate 6. A through hole 10 with high aspect ratio, having a small diameter of 0.9 μm, and a deep depth of 1.2 μm, for example, is disposed in a direction approximately normal to the principal plane of the substrate 6, physically connecting the upper and lower aluminum wirings 11 and 8. As a result, the edges of the upper and lower mouths 10b and 10c of the through hole 10 are respectively opened within the upper wiring 11 and to the lower aluminum wiring 8. The side wall 10a has a cylindrical PSG surface which is electrically insulative, having a high resistance sufficient to maintain the electrical insulation between both aluminum wirings 8 and 11.

As will be described later, when the through hole 10 is opened in the PSG layer 9 before the formation of the upper aluminum wiring 11, the side wall 10a may be partially covered by an aluminum layer which is deposited during an aluminum sputtering deposition process preceding the lithographic patterning of the aluminum wiring 11. However, the above-described electrical insulation is maintained thanks to the high aspect ratio of the through hole 10 in cooperation with properly selected oblique sputtering angle of aluminum vapor, which creates an effective shadow effect for the sputtering. Furthermore, it is preferred that the through hole 10 have an overhanging side wall 10d in order to achieve a more effective shadow effect, as illustrated in the cross-sectional view of FIG. 4. Isotropic reactive gas etching is suitable for providing the overhanging side wall as described later.

When, when the through hole 10 is opened after the formation of the upper aluminum wiring 11, then the above described problem regarding the insulating power of the side wall 10a is easily solved; however, the durability of the relevant mask for the lithographic patterning of the upper aluminum wiring is not high. For overcoming this problem, a mask having a pattern with an opening in the form of the mouth of the through hole or the trench is used to provide an opening in the predetermined portion of the wirings, after which a through hole or a trench is formed by the aid of above-described opening. This process will be described.

Figure 5:
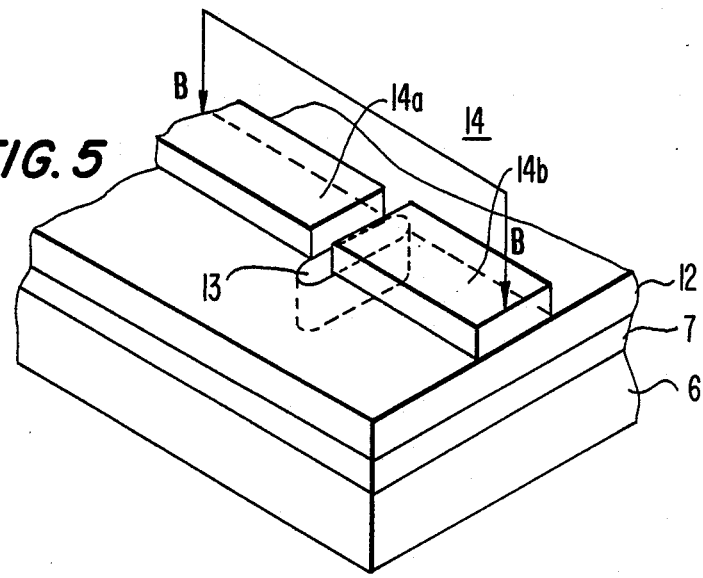
FIG. 5 is a perspective view of a conducting link of a second embodiment of the present invention.
Figure 6:
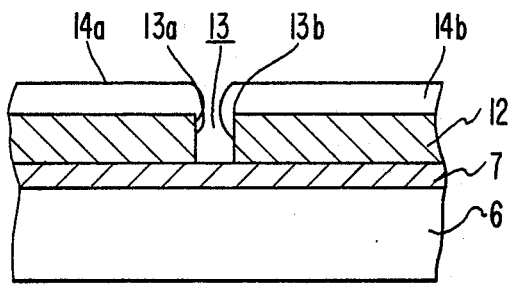
FIG. 6 is a cross-sectional view of the conducting link of FIG. 5, taken along line B—B.

FIG. 5 is a perspective view of a semiconductor device, partially broken away to reveal a structure of a second embodiment of the present invention, illustrating an activatable conductive link (a trench or a slot) for linking two aluminum wirings arranged on the same level formed on a phosphorous silicate glass (PSG) layer. FIG. 6 is a cross-sectional view of the second embodiment taken along line B—B shown in FIG. 5.

Figure 7:
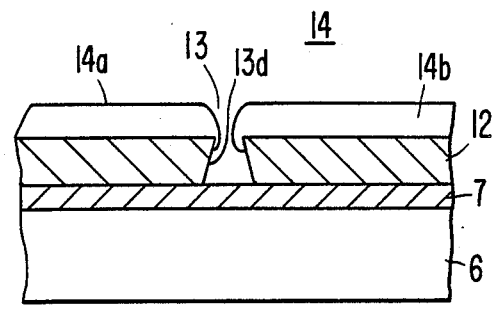
FIG. 7 is a cross-sectional view of a conducting link, including a through hole having an overhanging side wall.

The semiconductor device shown in FIG. 5 and FIG. 6, is a one layered structure. In the device, a PSG layer 12, a silicon dioxide ($SiO_2$) layer 7 and a silicon substrate 6 are laminated in the recited order. In a portion of the device shown in FIG. 6, two aluminum wirings 14a and 14b are separated by a trench 13 disposed in a PSG layer 12. Both aluminum wirings 14a and 14b are formed on the PSG layer 12. The trench 13 has a small lateral length (width) of 0.9 μm and a deep depth of 1.2 μm, for example, having a high aspect ratio of 1.33. The trench 13 is disposed in a direction approximately normal to the principal plane of the substrate 6, physically connecting and electrically disconnecting both aluminum wirings 14a and 14b. As a result, the longitudinal length of the trench 13 is greater than the width of the aluminum wirings 14a and 14b, making the edges 13b of the mouth of the trench 13 extend post both side edges of the aluminum wirings 14a and 14b, providing a wider tolerance of alignment of the wirings, 14a and 14b with the trench 13. The side wall 13a has a PSG surface which is electrically insulative, having a high resistance sufficient to maintain electrical insulation between both aluminum wirings 14a and 14b. The trench 13 is opened in the PSG layer 12 before the formation of an aluminum layer over the PSG layer 12 using an aluminum sputtering deposition. As a result, a problem that the side wall 13 is covered partially with an undesirable aluminum layer during the aluminum sputtering deposition, may occur. However, the problem is not so critical as with the first embodiment. This is because at least one of the side walls 13a of the trench 13, and the bottom surface thereof are shaded from the impinging aluminum vapor during the process due to the shadow effect of the aluminum sputtering deposition process. For reasons similar to those described with respect to the first embodiment, it is desirable that the trench 13 have an overhanging side wall 13d as illustrated in a cross-sectional view of FIG. 7, which is achieved by employing reactive gas etching as described later.

Figure 8:
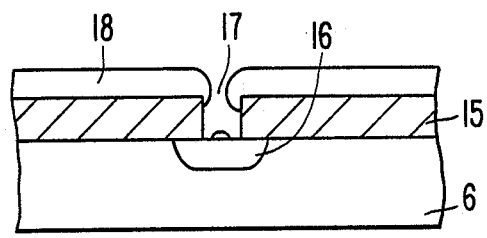
FIG. 8 is a cross-sectional view of a conducting link of a third embodiment of the present invention.

FIG. 8 is a cross-sectional view illustrating a third embodiment of the present invention, which is a modification of the first embodiment, in which the lower aluminum wiring of the first embodiment is replaced with a doped conductive region. In this case, as shown in the figure, a doped region 16 which is conductive, is formed in a silicon substrate 6 immediately beneath a through hole 17. An aluminum wiring 18 is insulated from the doped region 16 by a silicon dioxide ($SiO_2$) layer 15. The through hole 17 has a high aspect ratio, being capable of acting as a conducting link to connect the aluminum wiring 18 to the doping region 16 if so required.

In the above-described three embodiments, aluminum wirings or aluminum layers are disclosed however, other aluminum alloys such as aluminum silicon alloys and aluminum copper alloys which are conventionally used in a semiconductor device, are also applicable. Further, PSG layers 9 and 12 in the above described embodiments can be replaced by other oxide layers such as a silicon dioxide ($SiO_2$) layer if the use thereof is allowed in view of production technology.

Figure 9A:
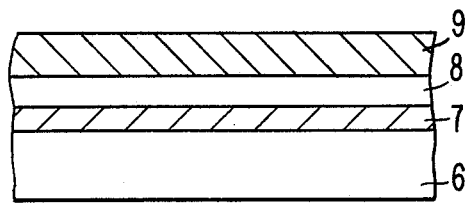
FIGS. 9(a) to 9(d) are cross-sectional views illustrating the fabricating and activating steps for a conducting link of the first embodiment of the present invention.
Figure 9B:
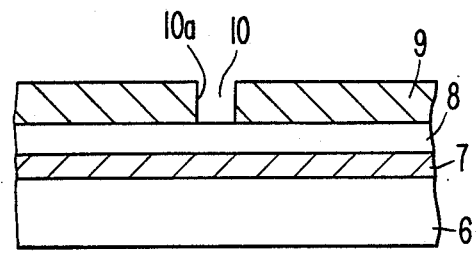

Fabrication and activation methods for the activatable conductive links will be described by referring to drawings. FIGS. 9(a) to (d) are for explaining a fabricating and activating method for an activatable conductive link of the first embodiment of the present invention. The steps are as follows:

In previous fabrication steps, a silicon dioxide ($SiO_2$) layer 7 is formed over a silicon (Si) substrate 6, a lower aluminum layer is formed over the silicon dioxide layer 7, and subsequently, the lower aluminum layer is patterned to form a lower aluminum wiring 8. Next, a PSG layer 9 is formed over the aluminum wiring 8 and the silicon dioxide ($SiO_2$) layer. Thus, a laminated structure is formed as shown in FIG. 9(a). The techniques used in the above described steps are all conventional ones currently used in the field. To the laminated structure of FIG. 9(a), the following steps are applied in sequence:

(1) A through hole 10 is opened in the PSG layer 9 at a specified portion having a depth sufficient to contact the underlying lower aluminum wiring 8. The aspect ratio (depth/diameter) of the through hole 10 is taken higher than 1.0. The method of opening the through hole 10 is a conventional reactive ion etching method which is an anisotropic etching method and suitable for a substantially precise patterning.

Figure 9C:
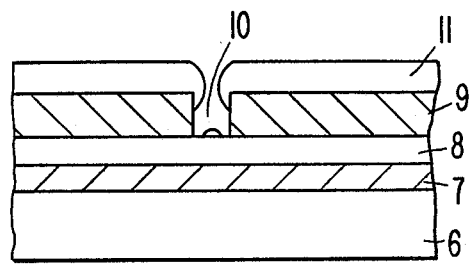

(2) Then, over the entire surface of the substrate, as shown in FIG. 9(c), aluminum is sputtered to form an upper aluminum layer, which is patterned thereafter to form an upper wiring 11. The substrate 6 is placed in a reaction chamber of the associated aluminum sputtering deposit apparatus (not shown) apart from the source of aluminum vapor, such that aluminum vapor impinges onto the substrate 6 obliquely, providing a shadow effect to the through hole 10 to insure that an uncovered side wall surface of PSG is provided to the through hole 10. Consequently, the electrical insulation between the upper aluminum layer and the lower aluminum wiring 8 is assured. The angle of the direction of sputtering aluminum vapor with respect to the normal to the principal plane of the PSG layer 9 is to be selected properly depending on the aspect ratio of the through hole 10. By the resulting structural configuration, the lower aluminum wiring 8 and the upper aluminum layer are still electrically insulated from each other. Subsequently, the upper aluminum layer is patterned in a conventional manner to form an upper aluminum wiring 11 as shown in FIG. 9(c).

Figure 9D:
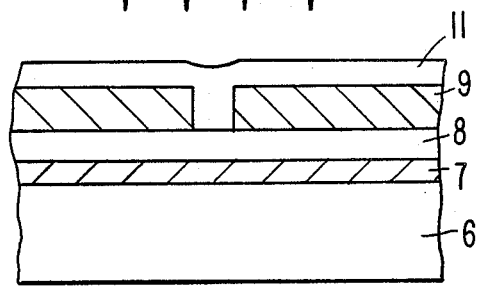

(3) Thereafter, when the connection between the upper aluminum wiring 11 and the lower aluminum wiring 8 is required, the aluminum layer 11 is irradiated from the top side with a spot of an excimer laser pulse having high energy and narrow pulse width, as shown by arrows L of FIG. 9(d). The irradiated portion of the upper aluminum wiring 11 is instantaneously melted. The melted aluminum flows into the through hole 10, filling up it completely. As the result, the aluminum wiring 11 and the aluminum wiring 8 are electrically connected. The connection is substantially steady and reliable.

The employed excimer laser is, for example, a pulse of an Ar F excimer laser (wave-length: 193 nm), having an energy density of 10 $J/cm^2$ and a pulse width of 15 ns. Thus, one pulse shot is enough to activate the conducting link 10. A shot of the laser pulse having such high energy density and narrow pulse width serves to confine the thermal diffusion within a small area in the vicinity of the irradiated portion on the substrate, preventing damage caused by an undesirable temperature rise, such as the alloying of aluminum members with adjacent silicon members. A low energy density laser beam below 3 $J/cm^2$ is not effective to melt the aluminum of the relevant aluminum wirings instantaneously, and a high energy density over 15 $J/cm^2$ is harmful in that it damages the aluminum wirings 8 and 11. Accordingly, an energy density ranging from 5 to 12 $J/cm^2$ is desirable for a practical use. A longer pulse (having a width of 1 $\mu s$, for example), or a continuous laser beam also cause damage, and thus are not suitable for practical use. Other kinds of excimer lasers, such as a Kr $F_2$ excimer laser (wave-length:248 nm), an Xe excimer laser (wave-length:308 nm), are also available in this field.

Figure 10A:
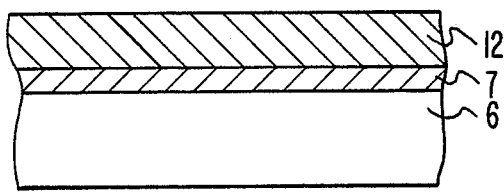
FIGS. 10(a) to 10(d) are cross-sectional views illustrating the fabricating and activating steps for a conducting link of the second embodiment of the present invention.
Figure 10B:
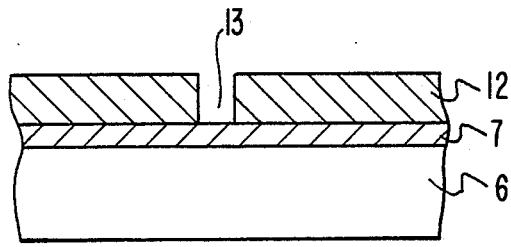
Figure 10C:
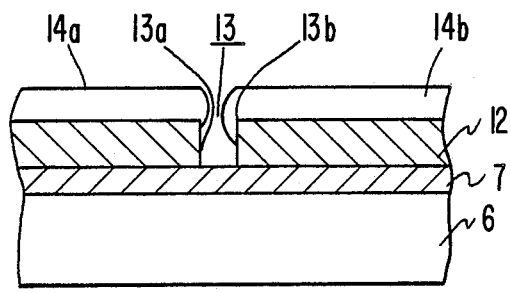
Figure 10D:
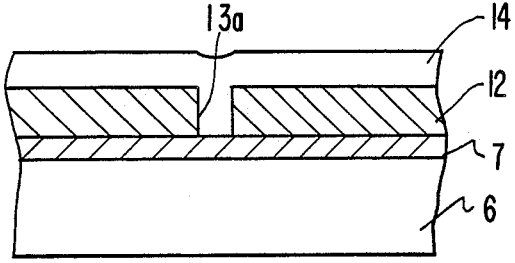

The method for fabricating an activatable conductive link of the second embodiment is almost similar to that of the first embodiment, and may be easily understandable for those skilled in the field. The fabricating method thereof is described briefly. A laminated structure comprising, a PSG layer 12, a silicon dioxide ($SiO_2$) layer 7, and a substrate 6 laminated in the recited order, is previously formed as shown in FIG. 10(a). Then, a trench 13 is opened in the PSG layer 12 at a specified portion, employing a conventional reactive ion etching method as shown in FIG. 10(b). Subsequently, an aluminum layer is formed over the PSG layer 12. Thereafter, the aluminum layer is patterned to form an aluminum wiring 14a and 14b which are traversed by the trench 13 as shown in FIG. 10(c). The subsequent activation is performed in the same manner as that of the first embodiment, and further description thereof may be omitted. FIG. 10(d) illustrates the state of the conducting link of the second embodiment after the activation thereof.

As already briefly described above, it is an important point to secure a portion of the surface of the side wall 10a, made of PSG layer, which is free from the deposition of aluminum.

An effective method for securing insulating capability of the through hole 10, is provided by the use of conventional lift off means such as photoresist resin. The resin is filled up in the through hole 10 in advance, and aluminum is deposited over the substrate, preventing the side wall 10a from the deposition of aluminum. Thereafter, the resin is removed from the through hole 10.

Figure 4:
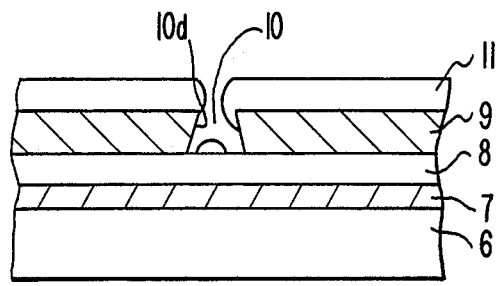
FIG. 4 is a cross-sectional view of the conducting link of FIG. 2, including a through hole having an overhanging side wall.

Another method, as already described above, is to form an overhanging side wall of the through hole by employing a conventional reactive gas etching method for opening the through hole. The employed etchant gas is a mixture of tetrafluoride carbon ($CF_4$) and trifluoromethane ($CHF_3$), for example. Because the etching method is essentially isotropic and the adhesion between a mask (not shown) and the PSG layer 9 is very strong, the resulting through hole is subject to a so-called 'under etching', having an overhanging side wall 10d as shown in FIG. 4, which is effective to provide the side wall 10d with a strong shadow effect, resulting in securing an exposed PSG portion on the side wall 10d.

Figure 11A:
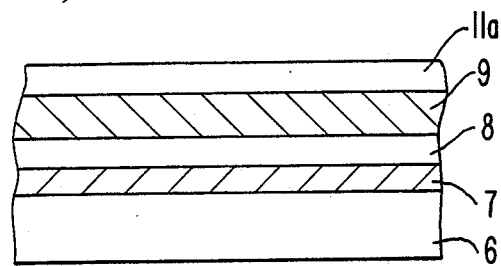
FIGS. 11(a) to 11(d) are cross-sectional views illustrating another set of fabricating and activating steps for a conducting link of the second embodiment of the present invention.
Figure 11B:
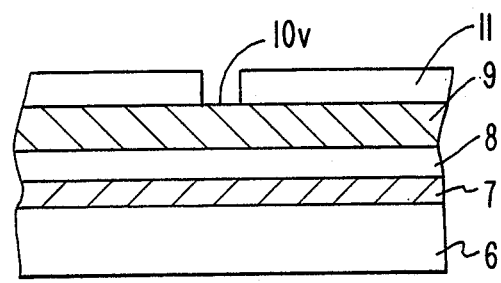
Figure 11C:
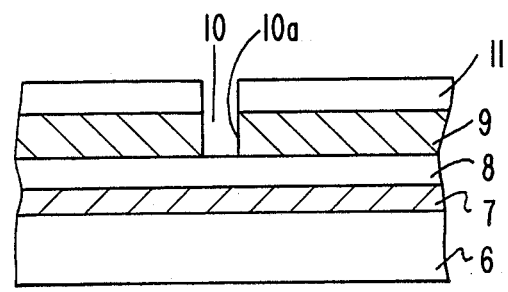
Figure 11D:
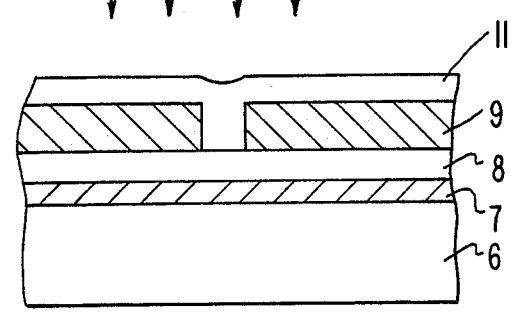

The definitely effective method is to open the through hole after patterning the upper aluminum wiring 11. The method is described with reference to FIG. 11. As shown in FIG. 11(a), an upper aluminum layer 11a, a PSG layer 9, a lower aluminum wiring 8, a silicon dioxide ($SiO_2$) layer 7 and a silicon substrate 6 are laminated in the recited order by conventional fabricating methods of a semiconductor device. Then the upper aluminum layer 11a is patterned to form an upper aluminum wiring 11, as shown in FIG. 11(b), including a through hole pattern 10v opened amid the pattern of the upper aluminum wiring 11, at a predetermined location, by employing a mask (not shown). Then, the PSG layer 9 immediately beneath the via hole pattern 10v, is etched by a conventional reactive ion etching method, or a conventional reactive gas etching, until the formed hole reaches the underlying lower aluminum wiring 8. Thus opened through hole 10 has a side wall 10a having an entirely exposed PSG surface. Thus, the conducting link is completed as shown in FIG. 11(c). The activating method of thus formed through hole 10 is the same as described above, and the resulting through hole is shown in FIG. 11(d).

Figure 12A:
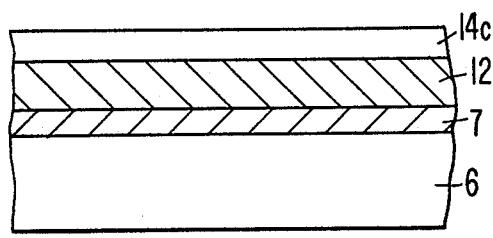
FIGS. 12(a) to 12(d) are cross-sectional views illustrating another set of fabricating and activating steps for a conducting link of the first embodiment of the present invention.
Figure 12B:
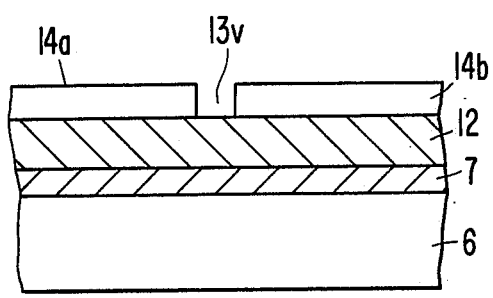
Figure 12C:
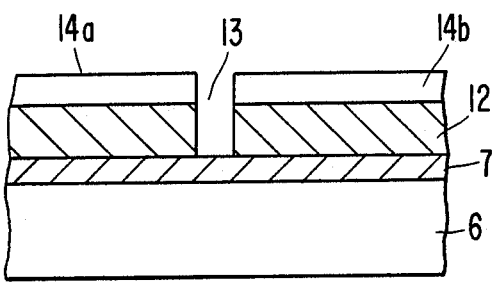
Figure 12D:
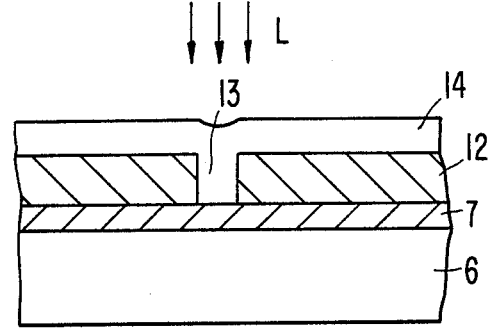

The method for fabricating an activatable conductive link of the second embodiment in the above-described manner, is almost similar to that of the first embodiment, being easily understandable for those skilled in the field. The fabricating method thereof, therefore, is described briefly. A laminated structure comprising an aluminum layer 14c, a PSG layer 12, a silicon dioxide ($SiO_2$) layer 7, and a substrate 6 laminated in the recited order is previously formed as shown in FIG. 12(a). Then, the aluminum layer 14c is patterned to form an aluminum wiring 14 including a traversing slit pattern 13v disposed at a position where a trench 13 is to be disposed as shown in FIG. 12(b). Subsequently, the trench 13 is opened in the PSG layer 12 over the slit 13v employing a conventional dry etching process, as shown in FIG. 12(c). As the result, the aluminum wiring 14 is traversed by the trench 13, and separated into aluminum wirings 14a and 14b as shown in FIG. 12(c). Since the subsequent activation method is the same as that of the first embodiment, further description thereof is omitted. FIG. 12(d) illustrates the state of the conducting link after the activation thereof.

With regard to the activation process of a conducting link of the second embodiment, it should be noted that the trench 13 plays an important roll for achieving a reliable connection between the associated aluminum wirings. The trench 13 introduces the melted aluminum flow thereinside, filling up the trench 13 and planarizing the cut portion between the wirings. The resulting connection is strong and steady. Without the trench 13, the melted aluminum at the connecting point will overflow in the vicinity of the irradiated portion by the laser pulse, resulting in an unreliable connection between the wirings to be connected.

The method for fabricating the third embodiment is the same as that of the first embodiment except for the step of previously forming a doped region 16 in the substrate 6. The method is not described, since the method may be easily understood by the skilled people in the field from the above description.

According to the present invention, as described above in detail, a conducting link is formed between two aluminum wirings in a semiconductor device, which are insulated from each other by an insulating layer. The conducting link is formed in the form of a through hole or a trench with a high aspect ratio, disposed in the insulating layer. When required, the two aluminum wirings are easily connected using a simple method, namely, irradiation with one shot of an excimer laser beam pulse. In addition, the contact hole has a substantially small size, occupying a small area on the relevant silicon substrate. The insulating capability of the link before activation thereof, and the conducting capability of the link after activation thereof, are both substantially steady and reliable. As a result, a semiconductor device with a high integration density is produced in a master slice system with low cost and high reliability in response to a customer's order.

The many features of the present invention are apparent from the detailed specification and thus it is intended by the appended claims to cover all such features and advantages of the device and the method which fall in within the true spirit and scope of the invention. Further, since numerous modifications and changes will ready occur to those skilled in the art, it is not desired to limit the invention to the exact construction and operation illustrated and described, and accordingly, all suitable modifications and equivalents may be resorted to, falling within the scope of the invention.

What we claim is:

1. A method for creating and activating a conducting link, in an integrated semiconductor circuit of a semiconductor device, selectively activatable in combination with a plurality of conducting paths which are electrically insulated from each other by a first insulating layer, said method comprising the steps of:

(a) forming a connecting hole with a high aspect ratio and an insulative side wall surface in said first insulating layer at a specified portion by employing a gas etching method;

(b) forming first and second conductive paths of metal such that said first conductive path is electrically insulated from said second conductive path to which said first conductive path is to be connected, by said insulating layer and said insulative side wall surface of said connecting hole; and (c) activating said conducting link, when activation is required, by locally heating said connecting hole and a region in the vicinity thereof, melting metal contained in the heated portion of at least one of said first and second conductive paths, causing the melted metal to flow into said connecting hole to fill up said connecting hole with the melted metal, and thus providing a conductive path between said first and second conductive paths.

2. A method for creating and activating a conducting link as set forth in claim 1, wherein said first conductive path is made or aluminum or aluminum alloy.

3. A method for creating and activating a conducting link as set forth in claim 2, wherein said step (c) comprises locally heating by employing an energy beam pulse.

4. A method for creating and activating a conducting link as set forth in claim 3, wherein said energy beam is an excimer laser beam.

5. A method for creating and activating a conducting link as set forth in claim 4, wherein the energy density of said excimer laser beam ranges from 5 J/cm$_2$ to 12 J/cm$_2$.

6. A method for creating and activating a conducting link as set forth in claim 1, wherein said semiconductor device has a semiconductor substrate, wherein said first conductive path and said second conductive path are arranged in a two-layer arrangement separated by said first insulating layer, wherein said connecting hole is a through hole, and wherein said second conductive path is made of one of aluminum or aluminum alloy formed over a second insulating layer formed over said semiconductor substrate, and a doped conductive region formed in said semiconductor substrate.

7. A method for creating and activating a conducting link as set forth in claim 6, wherein:

said step (a) comprises forming said through hole in said first insulator at a specified portion such that said through hole extends to said underlying second conductive path, and said step (b) comprises forming an aluminum or aluminum alloy layer over said second insulating layer including said through hole, and patterning said aluminum or aluminum alloy layer to form said first conductive path in alignment with said through hole, thus creating a conducting link which is in an insulating state.

8. A method for creating an activating a conducting link as set forth in claim 1, wherein said first conductive path and said second conductive path are arranged on said first insulating layer on the same level, and wherein said connecting hole is a trench having an insulative side wall.

9. A method for creating and activating a conducting link recited in claim 8, wherein said step (a) comprises forming said trench in said first insulator at said specified portion, said step (b) comprises forming an aluminum or aluminum alloy layer over said first insulating layer, including said trench, and patterning said aluminum or aluminum alloy layer to form said first and second conductive paths in alignment with said trench such that both of said first and second conductive paths are insulated from each other and are respectively in contact with mutually facing portions of the mouth edge of said trench.

10. A method for creating and activating a conducting link as set forth in claim 7, wherein said through hole is formed in said first insulating layer so as to have an over-hanging side wall in said through hole by employing an isotropic reactive etching method.

11. A method for creating and activating a conducting link, in an integrated semiconductor circuit of a semiconductor device, selectively activatable in combination with a plurality of conducting paths which are electrically insulated from each other by a first insulating layer, said method comprising the steps of:

(a) forming a first conductive path of aluminum or aluminum alloy over said first insulating layer, said first conductive path including a pattern of a mouth of a connecting hole at a specified portion where said conducting link is to be disposed;

(b) forming a connecting hole with a high aspect ratio and an insulative side wall surface in said first insulating layer, utilizing said pattern of the mouth of said connecting hole at said specified portion by employing a gas etching method;

(c) forming a second conductive path such that said first conductive path is electrically insulated from said second conductive path to which said first conductive path is to be connected by said insulating layer and said insulative side wall surface of said connecting hole; and (d) activating said conducting link, when activation is required by locally heating said connecting hole and a region in the vicinity thereof, melting metal contained in the heated portion of at least one of said first and second conducting paths, causing the melted metal to flow into said connecting hole to fill up said connecting hole with said metal, and thus providing a conductive path between said first and second conductive paths.

12. A method for creating and activating a conductive link as set forth in claim 9, wherein said trench is formed in said first insulating layer so as to have an over-hanging side wall in said trench by employing an isotropic reactive etching method.

13. A method for creating and activating a conducting link as set forth in claim 1, wherein said connecting hole with a high aspect ratio if formed in said first insulating layer by employing a reactive gas etching method.

14. A method for creating and activating a conducting link as set forth in claim 13, wherein said connecting hole with a high aspect ratio is formed so as to have an overhanging side wall in said connecting hole by employing an isotropic reactive gas etching method.

15. A method for creating and activating a conducting link, in an integrated semiconductor circuit of a semiconductor device, selectively activatable in combination with a plurality of conducting paths which are electrically insulated from each other by a first insulating layer, said method comprising the steps of:

(a) forming the first insulating layer over a first conductive path of aluminum or aluminum alloy;

(b) forming a connecting hole with a high aspect ratio in said insulating layer at a specified portion by employing a gas etching method, the connecting hole having an insulative side wall surface, and having a mouth in contact with said first conducting path;

(c) forming a second conducting path of aluminum or aluminum alloy over said first insulating layer by sputtering aluminum in a direction oblique to a surface of said first insulating layer, such that said first conductive path is electrically insulated from said layer of aluminum or aluminum alloy, by said first insulating layer and said insulative side wall surface of said connecting hole;

(d) patterning said layer of aluminum or aluminum alloy to form said second conducting path such that a mouth of said connecting hole is in contact with said second conducting path; and (e) activating said conducting link, when activation is required, by locally heating said connecting hole and a region in the vicinity thereof, melting metal contained in the heated portion of said second conducting path, causing the melted metal to flow into said connecting hole to fill up said connecting hole with the melted metal, and thus providing a conducting path between said first and second conductive paths.

16. A method for creating and activating a conducting link, in an integrated semiconductor circuit of a semiconductor device, selectively activatable in combination with a plurality of conducting paths which are electrically insulated from each other by a first insulating layer, said method comprising the steps of:

(a) forming the first insulating layer over a semiconductor substrate;

(b) forming a connecting hole with a high aspect ratio and an insulative side wall surface in said first insulating layer at a specified portion by employing a gas etching method;

(c) forming a layer of aluminum or aluminum alloy over said first insulating layer to define first and second conducting paths by sputtering aluminum in a direction oblique to a surface of said first insulating layer, such that said insulative side wall surface of said connecting hole is maintained insulative;

(d) patterning said layer of aluminum or aluminum alloy to form said first and second conducting paths such that a mouth of said connecting hole is in contact with said first and second conducting paths, said first and second conducting paths being insulated from each other by said connecting hole; and (e) activating said conducting link, when activation is required, by locally heating said connecting hole and a region in the vicinity thereof, melting metal contained in the heated portion of said first and second conducting paths, causing the melted metal to flow into said connecting hole to fill up said connecting hole with the melted metal, thus providing a conductive path between said first and second conductive paths.

* * * * *